United States Patent [19]

Pepe et al.

[11] Patent Number: 5,406,701
[45] Date of Patent: Apr. 18, 1995

[54] FABRICATION OF DENSE PARALLEL SOLDER BUMP CONNECTIONS

[75] Inventors: Angel A. Pepe, Irvine; David M. Reinker, Rancho Santa Margarita; Joseph A. Minahan, Simi Valley, all of Calif.

[73] Assignee: Irvine Sensors Corporation, Costa Mesa, Calif.

[21] Appl. No.: 120,675

[22] Filed: Sep. 13, 1993

Related U.S. Application Data

[63] Continuation-in-part of Ser. No. 955,461, Oct. 2, 1992, abandoned.

[51] Int. Cl.⁶ .............................................. H05K 3/34
[52] U.S. Cl. ...................................... 29/840; 29/843; 228/180.22
[58] Field of Search ................. 29/830, 831, 840, 877; 228/180.2, 215

[56] References Cited

U.S. PATENT DOCUMENTS

| | | | |
|---|---|---|---|
| 3,392,442 | 7/1968 | Napier et al. | 29/840 |
| 3,436,818 | 4/1969 | Merrin et al. | 29/840 |
| 3,486,223 | 12/1969 | Butera | 29/840 |
| 4,617,730 | 10/1986 | Geldermans et al. | 29/843 |
| 5,007,163 | 4/1991 | Pope et al. | 29/840 |
| 5,075,965 | 12/1991 | Carey et al. | 29/840 |
| 5,203,075 | 4/1993 | Angulas | 228/180.22 X |

Primary Examiner—Carl J. Arbes
Attorney, Agent, or Firm—Thomas J. Plante

[57] ABSTRACT

A method and product are disclosed in which multiple solder bumps on a first planar surface are guided into engagement with terminals on a second planar surface by means of holes formed (by a photolithographic process) in a dielectric layer, which has been added to the second surface to provide the holes (or sockets) through which the solder bumps (or plugs) extend. The perforated (hole-providing) layer may be formed of one of several materials. The preferred perforated layer material is a photo-definable polyimide, which is hardened by heating after the holes have been formed. Small solder bumps may be formed inside the holes on the second surface, in order to facilitate bonding between the solder bumps on the first surface and the terminals on the second surface.

25 Claims, 14 Drawing Sheets

FABRICATION OF DENSE PARALLEL SOLDER BUMP CONNECTIONS

This application is a continuation in-part of application Ser. No. 955,461, filed Oct. 2, 1992, now abandoned.

BACKGROUND OF THE INVENTION

This invention relates to a structure and method which insure correct alignment of a large number of closely spaced solder bumps which extend between two facing planar surfaces. A need for the invention exists in numerous modern electronic systems.

An example of an electronic system to which this invention is relevant is the module of stacked integrated circuit (IC) chips developed by the assignee of this application for use with focal plane detector arrays, as shown in U.S. Pat. No. 4,551,629 and 4,672,737. A two-dimensional focal plane array of photodetectors may contain thousands of separate photodetectors, each electrically connected to a separate lead (having a terminal) at the focal plane surface of a module compromising a large number of stacked layers, each of which layers is an integrated circuit (IC) chip. The photodetector signals are separately amplified and filtered in the module, prior to multiplexing the parallel signals and transmitting them from a back plane surface of the module to remote circuitry. An example of a focal plane configuration is one having 64×64 detectors in the array, i.e., a total of over 4,000 detectors. Center-to-center spacing between detectors, and between their respective terminals on the module, is presently as low as 4 mils (0.004 in.), and may eventually be pushed as low as 2 mils (0.002 in.).

Clearly, the problem of providing a separate solder connection between each photodetector and its terminal on the module is extremely difficult. The term "solder" is used to mean any electrically conductive material which extends between each detector and its terminal. Solder bumps may be used in "flip-chip" bonding, i.e., a process in which solder bumps formed on facing planar surfaces are aligned, and then brought together to provide the desired individual, parallel electrical connections. Such a bonding process is discussed in common assignee U.S. Pat. No. 4,912,545.

Another example of an electronic system to which this invention is relevant is disclosed in common assignee U.S. Pat. No. 4,706,166. That patent relates to a practical method of forming an electronic memory module comprising stacked IC chips. The stacked module has a multiplicity of terminals formed on its access plane. Matching terminals are provided on a substrate having electrical lead-out conductors thereon. Aligned bonding (solder) bumps are formed on both the module terminals and the substrate terminals. After careful microscopic alignment, the two groups of solder bumps are moved together and flip-chip bonded. The solder is preferably reflowed by heating, in order to form welded joints. However, if heating threatens any part of the structure, pressure alone may be relied on to join the aligned solder bumps.

The shortest center-to-center distances between solder bumps on the memory module and its substrate will usually be 10 mils (0.010 in.). So the alignment task is not as daunting as in the photodetector bonding. But it is still a significant problem.

Flip-chip bonding is a recognized method of connecting aligned terminals located on facing planar surfaces. Flip-chip aligner bonders are available as manufacturing apparatus. Such bonders use suitable alignment techniques, such as optical alignment using radiation wavelengths to which one of the planar surfaces is transparent. Flip-chip aligner bonders also require leveling systems which can insure exact parallelism of the facing planar surfaces.

In other words, there are two problems which can interfere with the success of flip-chip bonding. Bonding failure can occur (1) from misalignment of matched bumps, or (2) from variations in the height of bumps sufficient to prevent their engagement even if aligned. The latter problem is often referred to as the planarity problem, because variations of the planar surfaces which support the bumps may prevent two matched bumps from engaging one another. If the opposing surfaces are not exactly parallel, or if one or both surfaces are not exactly flat, such failure of bump engagement may occur.

The present invention deals with these problems by providing a solder bump alignment process which, in effect, replaces flip-chip bonding techniques in aligning simultaneously many bonds having minimal center-to-center spacing.

A prior art process used to provide an improved version of flip chip bonding is an IBM process referred to as C4 (controlled collapse chip connection). A recent IBM patent, U.S. Pat. No. 5,075,965, summarizes the process: "In the C4 process, as distinguished from the earlier flip chip process, the solder wettable terminals on the chip are surrounded by ball limiting metallurgy, and the matching footprint of solder wettable terminals on the card are surrounded by glass dams or stop-offs, which are referred to as top surface metallurgy. These structures act to limit the flow of molten solder during reflow." (Column 2, lines 39–46). "To be noted is that the C4 process is a substantially self-aligning process. This is because of the interaction of the geometry of the solder columns or balls prior to reflow with the surface tension of the molten solder during reflow and geometry of the solder columns. When mating surfaces of solder column on the chip and the conductive footprint contact on the card touch, the surface tension of the molten solder will result in self alignment." (Column 3, lines 36–44).

The present invention provides a process which insures solder bump-to-terminal alignment. It has major advantages over the C4 process in certain situations. One such situation is where very small dimensions are required in center-to-center spacing of solder bumps. Another is the situation where a plurality of surface-to-surface bondings are required in a single package, i.e., a package in which transparent layers are not available for alignment purposes. A third advantage of the present invention over the C4 process is that it can be performed at lower temperatures, thus avoiding damage to nearby temperature sensitive elements, e.g., photodetectors.

SUMMARY OF THE INVENTION

The present invention uses a plug-and-socket form of solder bump bonding, which insures against the possible failures encountered by flip-chip bonding.

Solder bumps are formed on one side of the facing planar surfaces (first surface). On the other planar surface (second surface) matching terminals are formed.

Thereafter, a layer of dielectric material is added to the second surface, and holes are formed in the dielectric layer, each of which holes extends to a terminal on the second surface, and each of which holes is adapted to receive a solder bump formed on the first surface. The layer added to the second surface may be referred to as a "perforated dielectric layer."

If the bumps and their matching holes are not all aligned, the two facing surfaces are laterally movable relative to one another. When they "lock" in position, each solder bump (or plug) is extending through its matched hole (or socket) and is in engagement with the terminal at the bottom of the hole. Thereafter, the solder bumps are bonded to their matched terminals.

The preferred method of forming the "sockets" is adding a full layer of semi-solid material to the planar surface having the terminals, and then using photolithographic processes to precisely locate and create the holes.

In order to avoid problems due to variations in spacing between the planar surfaces, the present invention permits the use of solder bumps which are high enough to compensate for any such variations. During heating and reflow of the bumps, the solder material of each bump is effectively confined within its socket, thus preventing any risk of short circuiting to nearby terminals.

In one version of the process described above, a limited amount of solder is located in each of the holes, in contact with the second surface terminal at the bottom of each hole. The permits process steps to protect the terminals from oxidation, and to improve the terminal-to-solder electrical connections. It also permits use of lower solder bumps on the first surface, which in turn permits reduction of their diameters adjacent the first surface.

DETAILED DESCRIPTION OF PREFERRED EMBODIMENT

Figure 1:
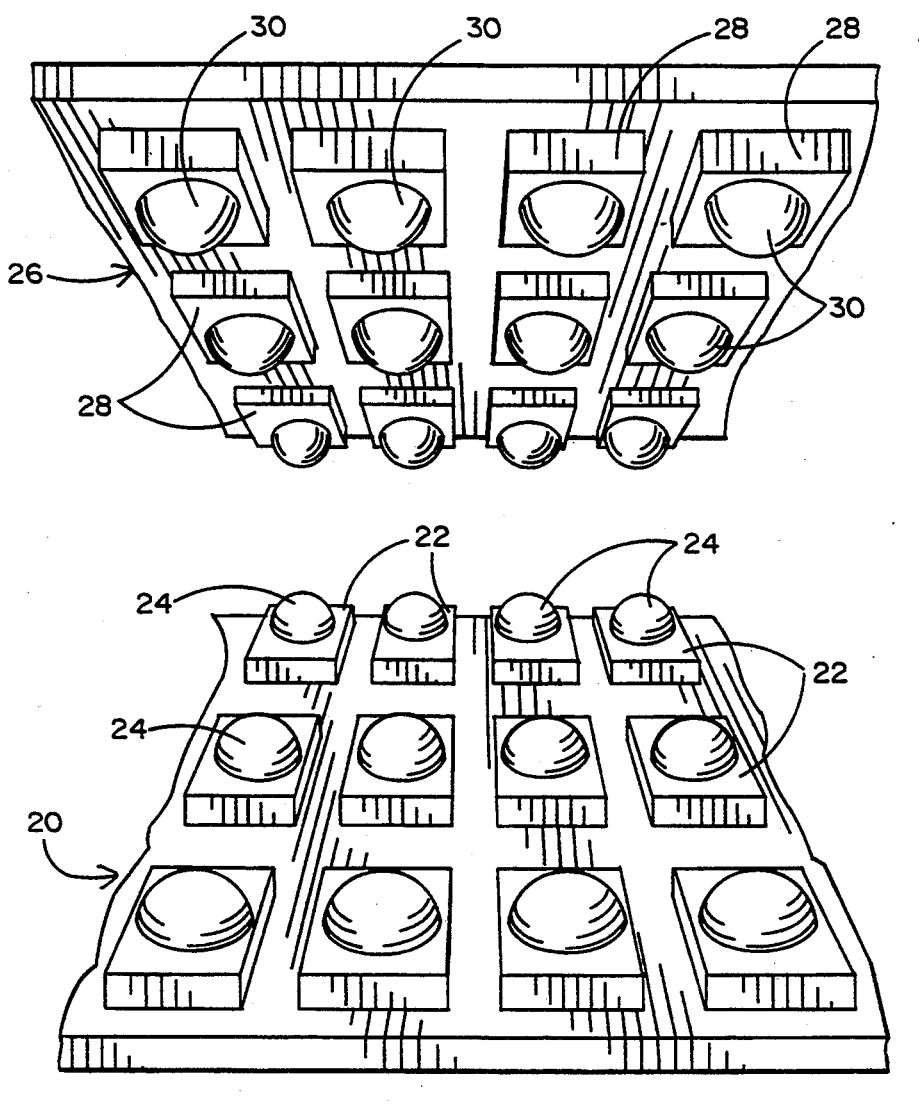
FIG. 1, which is copied from an advertisement, shows two facing planar surfaces which carry solder bumps, and which are part of a complex apparatus referred to as a "flip-chip aligner bonder"

FIG. 1 is used simply to illustrate the general concept of flip-chip bonding. It is copied from an advertisement of a company claiming "the newest technology in packaging focal plane arrays, flip-chip ICs, detectors, lasers, and transducers." The overall apparatus is quite complex, because it includes both a precision imaging aligning system and a non-contact autocollimating leveling system. FIG. 1 only shows the two plates which carry solder bumps, and which are to be aligned and then bonded together, usually by thermally caused reflow of the solder.

A lower plate 20 carries a large number of closely spaced terminals 22, each having a solder bump 24 secured to it. An upper plate 26 carries an equal number of closely spaced terminals 28, each having a solder bump 30 secured to it. The function of the flip-chip aligner bonder is to (1) place all of the solder bumps 24 in alignment with their matching solder bumps 30; (2) bring the two plates 20 and 26 into precise parallelism with one another; (3) move the matching solder bumps into simultaneous engagement; and (4) cause the engaging solder bumps to fuse with one another.

Figure 2:
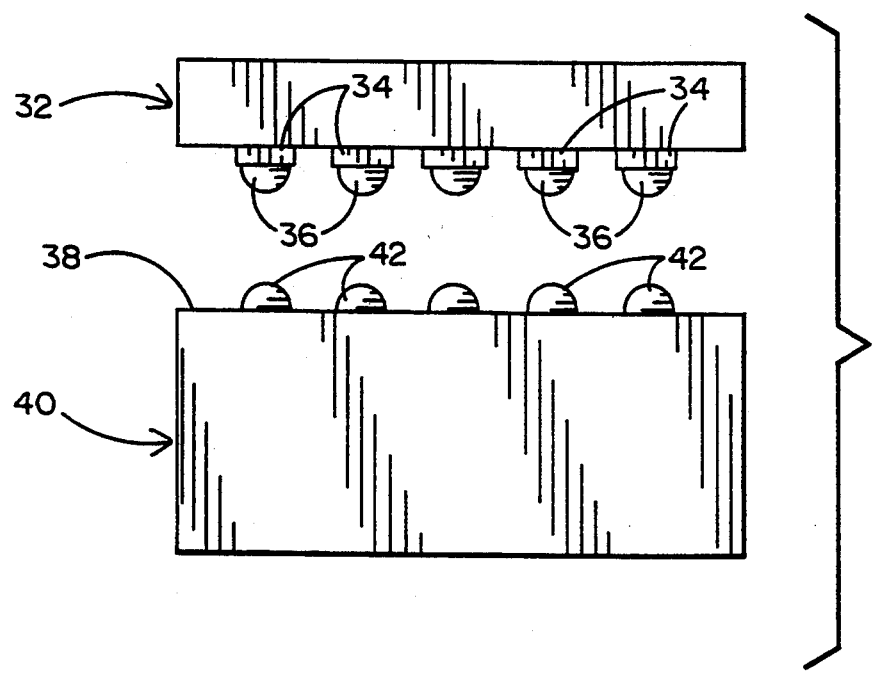
FIGS. 2 and 3, which are taken from common assignee U.S. Pat. No. 4,912,545, illustrate the use of flip-chip bonding of a photo-detector array.
Figure 3:
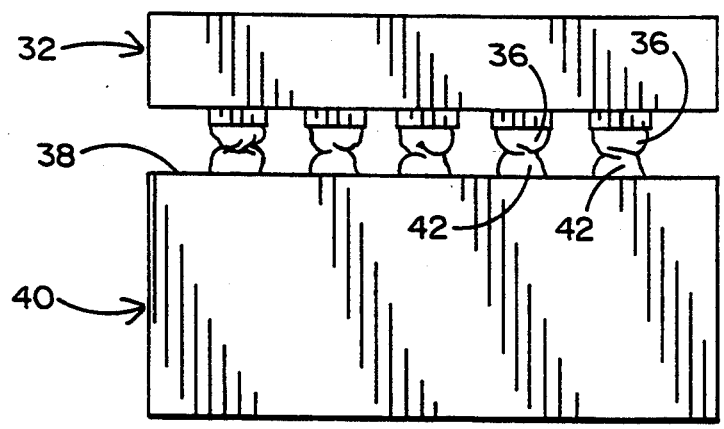

FIGS. 2 and 3, which are taken from common assignee U.S. Pat. No. 4,912,545, illustrate the use of flip-chip bonding of a photo-detector array having "backside" illumination. A detector-carrying substrate 32 is shown, on which an array of closely spaced photo-detectors 34 are mounted. Each detector 34 has a conductive terminal, such as gold-nickel, formed over it, and a bump 36 of conductive solder material, such as indium, deposited on the detector's conductive terminal.

The opposite surface 38 may be the access plane of a module 40 containing stacked IC chips, as described in common assignee U.S. Pat. No. 4,525,921; 4,551,629; 4,646,128; and 4,672,737. On the surface 38, a plurality of conductive solder bumps 42 have been formed of material such as indium, each bump deposited on a separate metallic terminal which has electrical contact with an individual electrical lead connected to circuitry inside module 40.

FIG. 3 shows the substrate 32 and module 40 after the flip-chip bonding process has been completed. Each pair of aligned bumps 36 and 42 have been pushed together (fused), thus providing electrical contact between each photodetector 34 and its corresponding electronic circuitry inside module 40. The fusion of solder bumps 36 and 42 usually is enhanced by application of heat. However, in certain situations, pressure alone may be relied upon, because of the possibility of thermal damage to the photodetectors.

Figure 4:
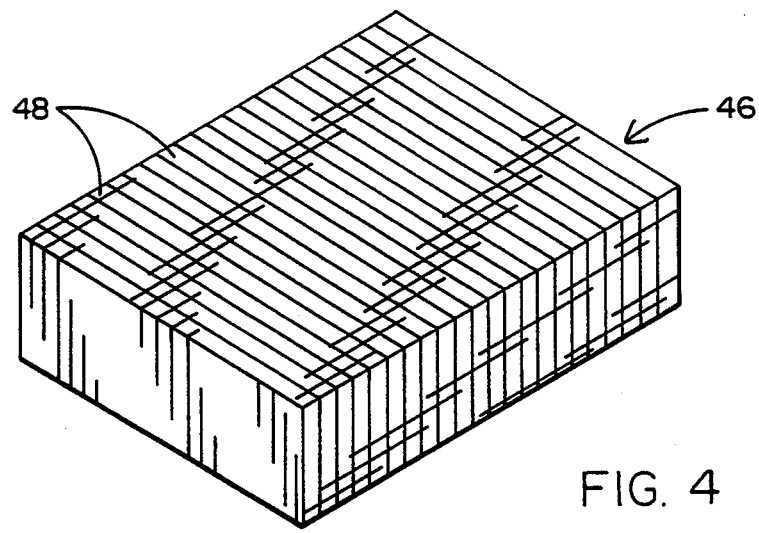
FIGS. 4–7, which are taken from common assignee U.S. Pat. No. 4,706,166, illustrate the use of flip-chip bonding in mounting a stack of IC memory chips on a substrate.
Figure 5:
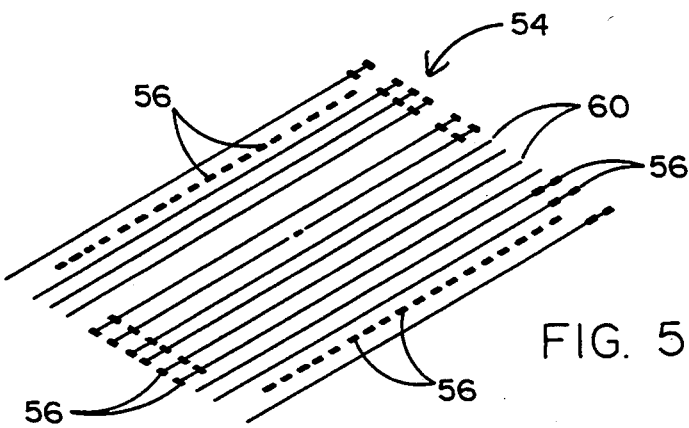
Figure 6:
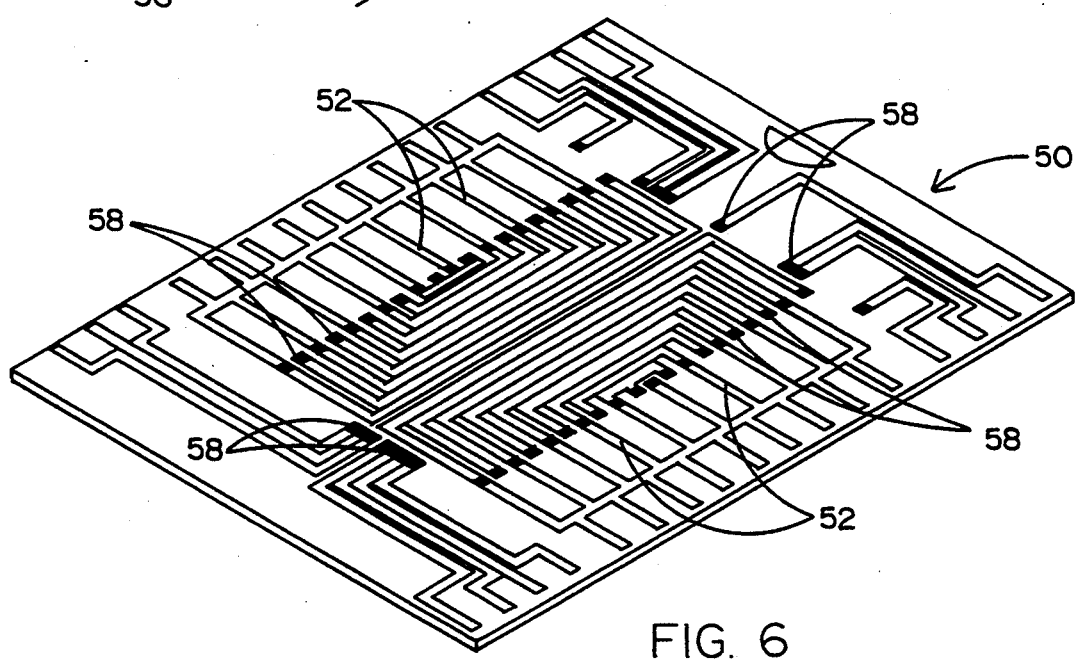
Figure 7:
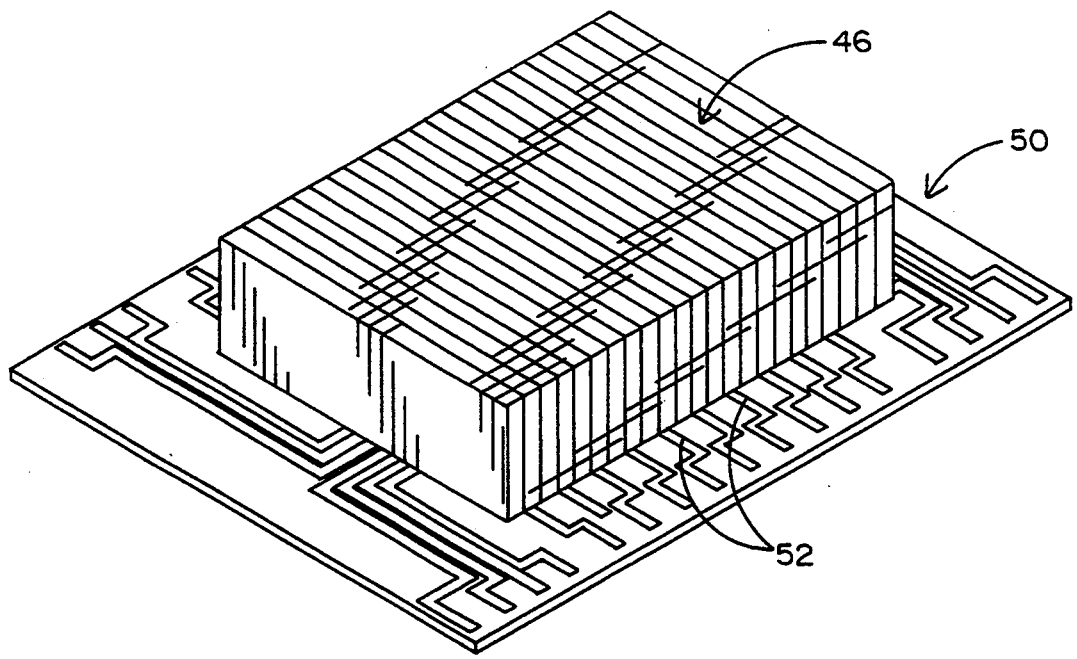

FIGS. 4–7, which are taken from common assignee U.S. Pat. No. 4,706,166, illustrate the use of flip-chip bonding in mounting a module containing stacked IC chips on a substrate. FIG. 4 shows a completed module 46, having a large number of layers 48, all or most of which are IC chips. FIG. 6 shows a stack-carrying substrate 50, which provides numerous electrical conductors 52 used to connect the circuitry inside module 46 with exterior circuitry. FIG. 5 shows the access plane circuitry 54 of module 46, which is not visible in FIG. 4.

A plurality of terminals 56 on the access plane are adapted to be individually bump bonded to matching terminals 58 located on substrate 50. The access plane includes numerous buses 60 interconnecting the stacked chips, which form the dense memory package. After solder bumps have been formed on each of the matched terminals 56 and 58, the aligned bumps are flip-chip bonded, resulting in the combined package shown in FIG. 7.

Figure 8:
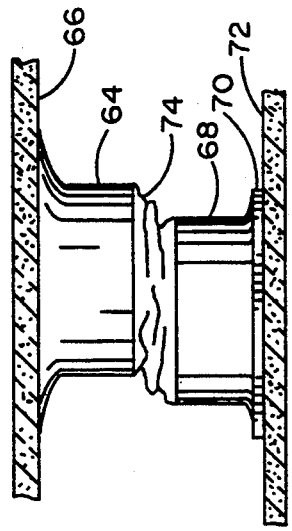
FIGS. 8 and 9 show schematically the effect of a slight misalignment of solder bumps in a flip-chip bonding process.
Figure 9:
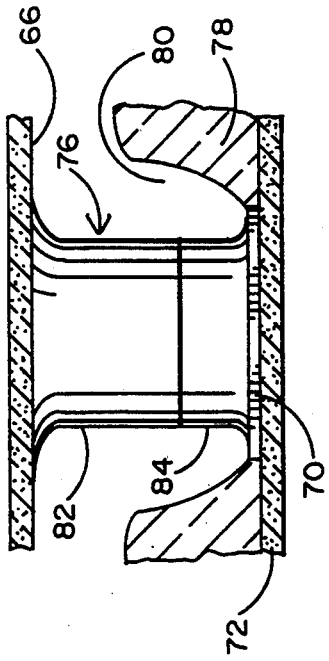

FIGS. 8 and 9 illustrate a common misalignment of individual solder bumps resulting from flip-chip bonding. As shown in both figures, a solder bump 64 is mounted on an upper planar surface 66; and a solder bump 68 is mounted on a terminal 70, which in turn is mounted on a lower planar surface 72. The slight misalignment shown in FIG. 8 results in the somewhat deformed fusion area 74 in FIG. 9, after the solder bumps 64 and 68 have been brought together, and caused to reflow.

If there is a major misalignment, the quality of the electrical connection may be jeopardized. Furthermore, two other purposes of the bonding process may be compromised. In addition to the primary purpose of providing electrical continuity, the bonding of solder bumps has two other important functions. Their bonding can be used to constitute a strong mechanical connection between the facing planar surfaces. It can also be used to provide a heat flow path, which may be of critical importance in preventing overheating of sensitive components.

Figure 10:
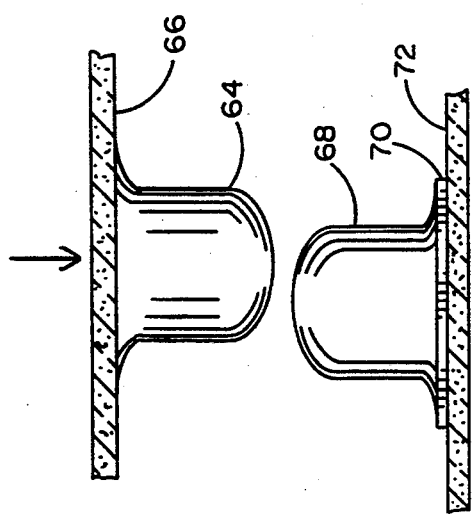
FIGS. 10 and 11 show schematically how the present invention uses plug-and-socket (solder bump and hole) combinations to avoid any bonding failures due to misalignment.
Figure 11:
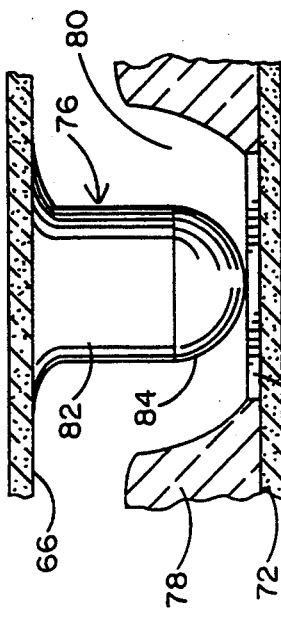

The present invention is disclosed in its simplest form in FIGS. 10 and 11. The upper surface 66 has formed thereon a relatively high solder bump 76. The lower surface 72 has a dielectric layer 78 covering it except for a hole 80, at the bottom of which the terminal 70 is located. In the bonding process, the material at the bottom of solder bump 76 flows, and forms both an electrical contact and a strong mechanical bond, as shown in FIG. 11.

In the embodiment of FIGS. 10 and 11, the solder bump 76 is shown as comprising an upper portion (or base) 82 formed of material having a relatively high melting temperature, and a lower portion (or tip) 84 formed of an electrical alloy having a relatively low melting temperature. This combination of higher melting point and lower melting point materials serves two purposes. First, the bonding flow of solder portion 84 occurs at a temperature which is safer for heat sensitive components in the structure. For example, solder bumps 76 have been used in which the base portion 82 is formed of indium having a melting point of 156° C., and the tip portion 84 is formed of an indium-tin eutectic alloy having a melting point of 117° C. Second, and no less important, is the fact that reflowing only the tip 84 guarantees that no solder will overflow its hole.

In order to ensure that the solder bumps 76 reach the terminals 70, it is desirable that the height of bumps 76 be greater than the depth of holes 80. For example, sockets (holes) 80 have been used having a depth of 10 microns, combined with solder bumps 76 having a height of 15 microns. The aspect ratio of both the bump dimensions and the hole dimensions is limited by their tendency to have a conical shape, and by the closeness of neighboring bumps and holes. Process techniques may be used to partially overcome this dimensional problem.

The total volume of solder material in each bump 76 should be such that none of the solder will flow out of the hole 80 into which it extends. In other words, none of the solder material will overflow from the hole as the upper planar surface 66 is brought toward the adjacent surface of dielectric layer 78. The solder will generally be caused to flow under combined heat and pressure. Experience indicates that it usually does not reach the socket walls. The amount of relative motion of the facing planar surfaces during bonding will preferably be 2–3 microns, leaving a slight space between planar surface 66 and the adjacent surface of layer 78.

Figure 12:
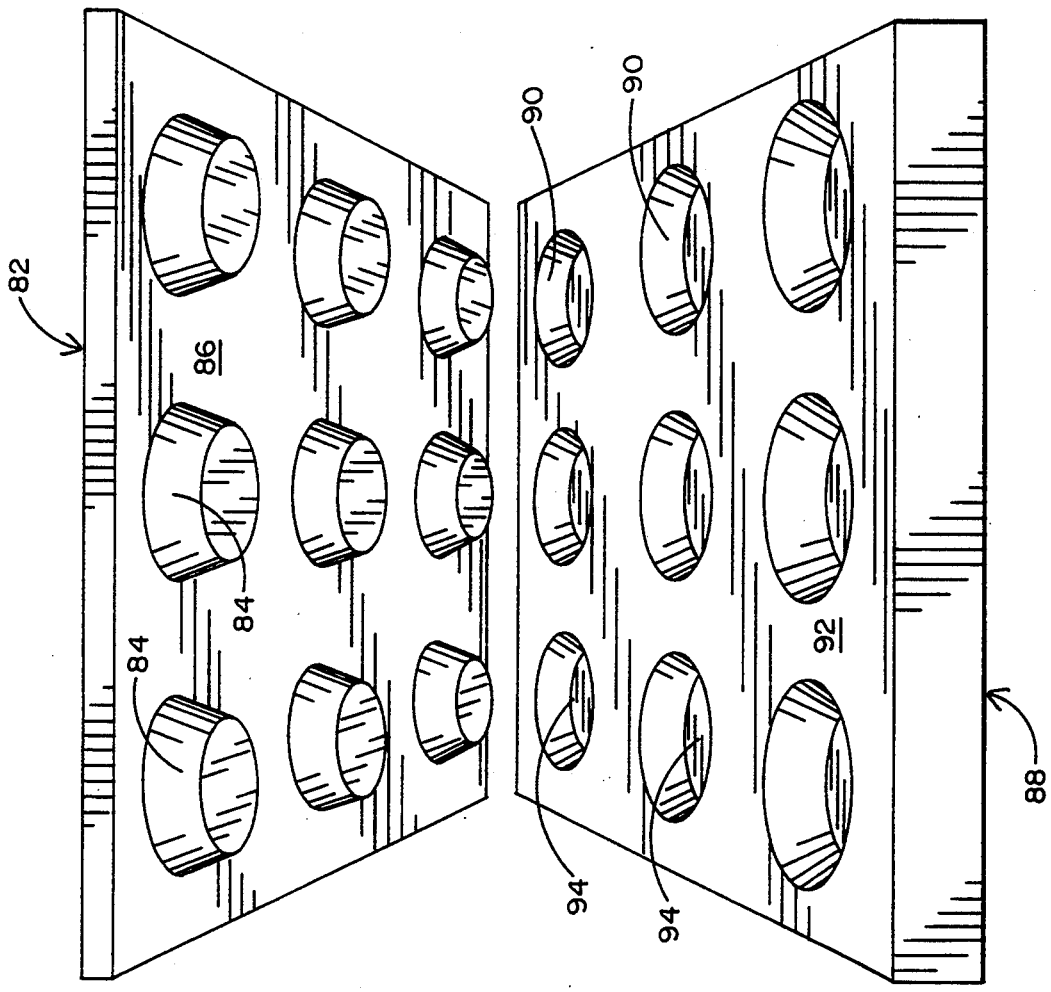
FIG. 12 is similar to FIG. 1, except that it shows the plug-and-socket soldering structure of the present invention, instead of the standard flip-chip bonding.

FIG. 12 shows a plurality of aligned plug and socket (solder bump and hole) combinations in a general configuration similar to that of FIG. 1. However, in FIG. 12, holes in the lower planar surface have replaced solder bumps. A first (upper) member 82 has a plurality of solder bumps 84 formed on its planar surface 86. A second (lower) member 88 has a plurality of holes 90 formed in its planar surface 92. Each hole 90 extends through to a metal terminal 94, and is so located as to be aligned with one of the bumps 84 when the members 82 and 88 are brought together.

It should be understood that the dimensions of the members 82 and 88 are not relevant to the present invention. They may be thin layers, or thick blocks. A particular advantage of the invention is that correct alignment does not depend on transparency of any of the members whose surfaces are to be interconnected by bump bonding.

Figure 13:
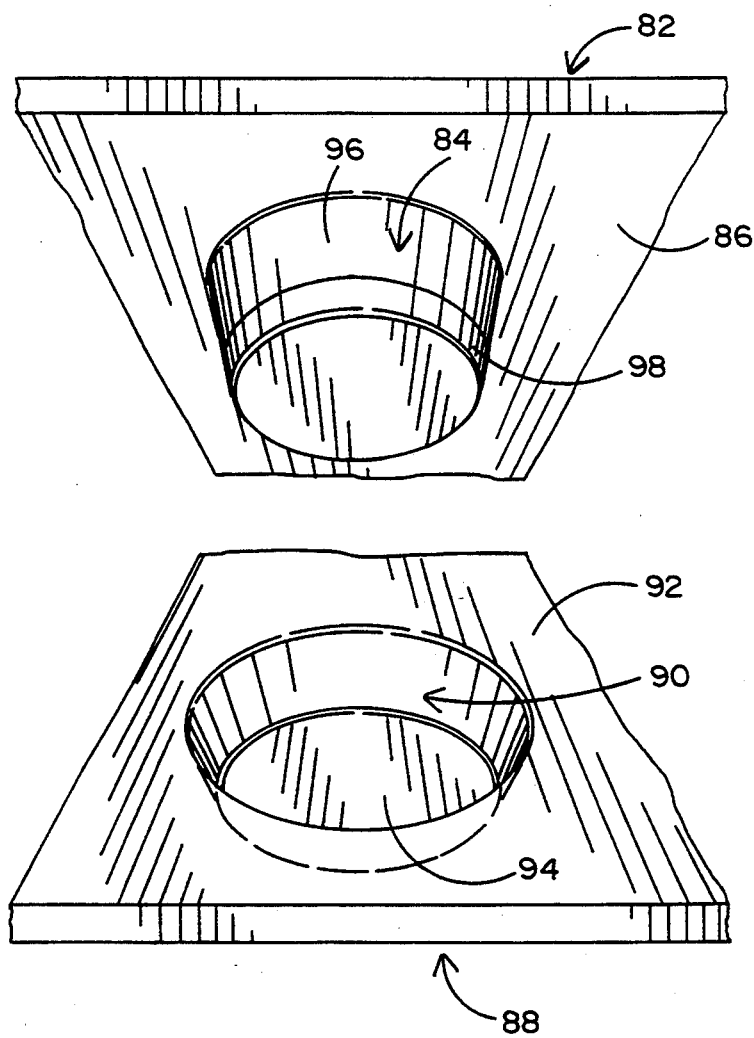
FIGS. 13 and 14 show a single plug-and-socket combination taken from FIG. 12, before and after the solder bump has been engaged with its aligned hole.
Figure 14:
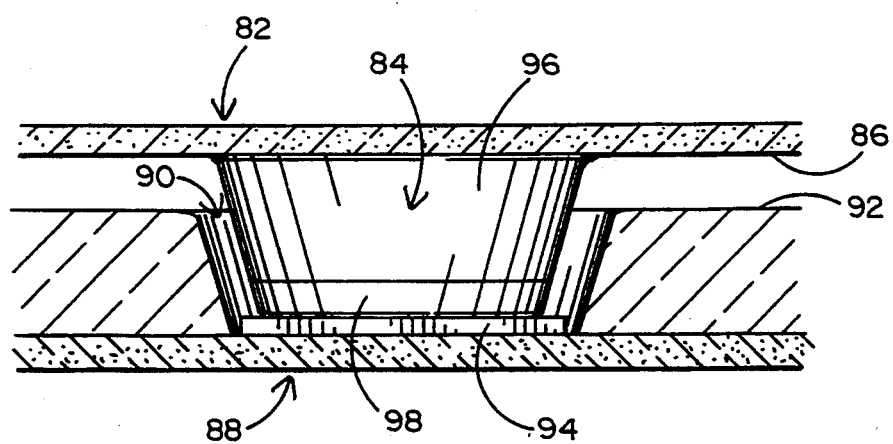

FIGS. 13 and 14 show one of the plug-and-socket combinations of FIG. 12. The shapes of the solder bumps and holes in FIGS. 12–14 are more realistic than those shown in FIGS. 10 and 11, which were exaggerated in order to more clearly illustrate the concept of the present invention. FIG. 13 shows the facing planar surfaces prior to alignment. Note that the solder bumps show the two portion structure, in which the base portion 96 is formed of a higher melting point material than the tip portion 98. This is considered a desirable, but not necessary, feature, which is useful in some situations.

As shown in FIG. 14, the lower end of the solder bump has engaged the metal terminal 94 at the bottom of hole 90, but planar surface 86 has not engaged planar surface 92. This distance differential ensures that any lack of exact planarity and parallelism of the planar surfaces will be compensated for. As the solder bumps are caused to flow under heat and pressure, their material will remain in the holes 90. As previously stated, about one-half of the distance between surfaces 86 and 92 will remain after the solder connections have been completed.

Experiments have demonstrated that the strength of the bond created by the multiplicity of partially melted and then solidified solder connections is capable of very securely holding together the members 82 and 88.

The methods of forming the solder bumps and their matching holes are, of course, important. Forming multiple solder bumps on a planar surface has been a common practice. Common assignee U.S. Pat. No. 5,104,820 discusses (Column 12) the options available, using lithographic processes. Such processes involve the use of photoresist material to control the precise locations in which the solder bumps are located. Two variations are discussed: (1) etch delineation, and (2) lift-off. The latter is generally preferred. Broadly the lift-off process includes: (a) covering the surface with photoresist, (b) masking the photoresist to provide a metallization pattern, (c) developing the exposed photoresist, (d) dissolving the exposed photoresist to uncover those portions of the access plane which provide the desired metallization pattern, (e) applying metal to the entire surface, and (f) dissolving the remaining photoresist, which carries along with it the metal not included in the metallization pattern.

Sputtering and evaporation, types of vacuum deposition, are two possible methods of applying metal to form solder bumps in the locations delineated by the photoresist. Although sputtering has been preferred in various other metallization processes, the present invention is better served by evaporation. There are several reasons for using evaporation. One is that it can be performed at a lower temperature, thus avoiding risk to nearby heat-sensitive elements. A second advantage of evaporation is that it provides metal deposition at a faster rate, permitting formation of higher solder bumps for a given diameter. And a third advantage is that evaporation is less likely than sputtering to create a "penumbra," i. e., a disk-like expansion of the bottom edge of each solder bump.

Figure 15:
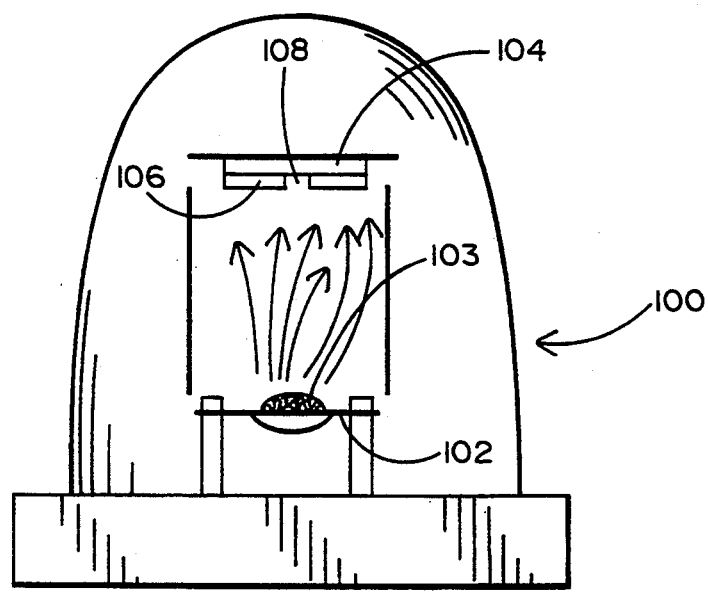
FIG. 15 shows an apparatus for forming solder bumps by an evaporation process.

FIG. 15, which is taken from common assignee U.S. Pat. No. 4,912,545, shows an apparatus for depositing solder by evaporation. A bell jar 100 provides a vacuum chamber. Inside and near the bottom of the bell jar, a metal "boat" 102 contains solder material, such as indium 103. Heating boat 102 causes the solder material to evaporate and flow upwardly in bell jar 100. Near the top of the evacuated chamber, a substrate 104 is supported, which in the present case would be the upper member 82 of FIG. 12. The substrate is covered with a layer 106 of photoresist material, in which windows 108 have been formed to locate the solder bumps. The evaporated solder material is deposited over the entire photoresist layer, as well as in windows 108. As the solder material is deposited, its temperature is sufficiently reduced to return it to solid condition. After substrate 104 has been removed from the bell jar, and after the photoresist material has been dissolved, the appropriately located solder bumps remain on the substrate.

The formation of the holes, or sockets, which are used to guide the solder bumps, requires a complex and novel process. Various approaches have been considered. A significant decision is the selection of the material in which the holes are formed. The present preference is to use a photo-definable polyimide material, e.g., Torray Industries material UR-3140. Other materials which might be used include photoresist, epoxy, and solder mask. The material used to provide sockets can be applied to the surface as a spun-on, viscous liquid which solidifies, or as a continuous film-like layer.

The polyimide material which is presently preferred is supplied in liquid form, and is spun on the underlying surface to form an uncured layer of non-flowing material. The polyimide material has the advantage that it can be easily built up to the necessary thickness. Prior to spinning on the polyimide, the spaced terminals have been formed on the solid surface below the polyimide. The decision as to which of the two facing planar surfaces should have the plugs and which should have the sockets may be determined by their relative heat sensitivities. The final solidifying (curing) of the polyimide material, referred to as imidization, requires heating to a temperature of, say, 250° C. Where one of the facing planar surfaces carries a photodetector array, the polyimide layer should be formed on the other facing surface, which is less likely to have elements threatened by the imidizing heat. Referring to FIGS. 2 and 3, in which the member 40 is a module containing stacked IC chips, the polyimide layer would be formed on the upper surface of member 40. In many situations, either of the two facing surfaces is equally suitable for receiving the polyimide layer.

Figure 16:
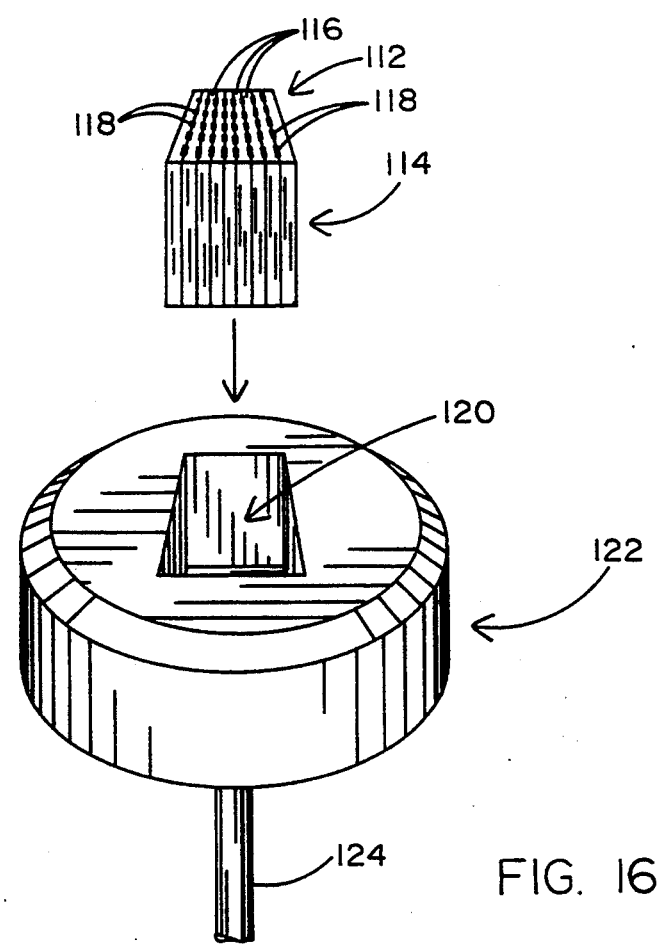
FIGS. 16 and 17 illustrate the process of applying a dielectric layer to one of the two facing planar surfaces.
Figure 17:
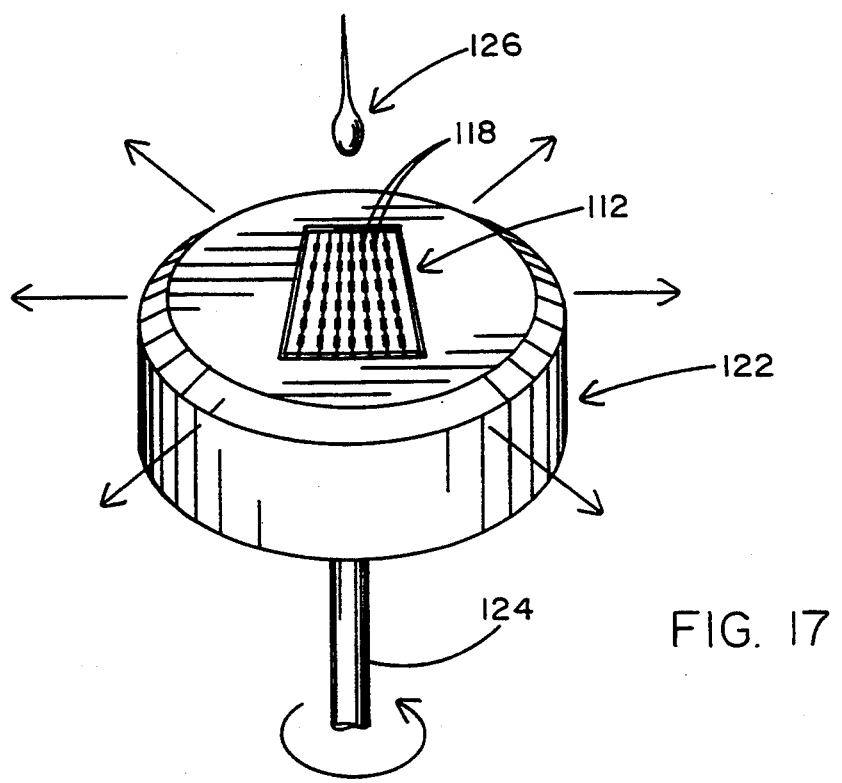

FIGS. 16 and 17 illustrate the concept of forming the polyimide layer by applying material in liquid form on the planar surface at a central location, and then spreading and partially drying the material by means of a spinning process. The underlying planar surface shown in FIGS. 16 and 17 is the access plane 112 of a module 114 containing stacked IC chips 116. After suitable metallization processes have been used, the access plane will have a two-dimensional array of metal terminals 118, each of which is in engagement with the end of an electrical lead coming from one of a multiplicity of parallel embedded IC circuits, and each of which is insulated from all of the other terminals 118.

As shown in FIG. 16, the module 114 is placed in a recess 120 formed in a spinner 122. As shown in FIG. 17, rotation of a shaft 124 causes spinner 122 to rotate rapidly. The liquid "polyimide" material 126 is first dropped on the exposed access plane 112 of module 114; and spinning is then started. The rapid rotation of spinner 122 causes the viscous liquid material to spread evenly over the access plane and its metal terminals 118. Enough layers of "polyimide" material are spun on to create a dielectric layer 128 (see FIG. 18) of the desired thickness, e.g., 10 microns. Subsequently, the polyimide material should be further dried at a suitable temperature.

The presently preferred photolithography used on the polyimide layer involves a mask which blocks light above the metal pads 118, but does not block light elsewhere. Highly collimated ultraviolet light applied from above the mask partially cures the photo-definable "polyimide" material except at the areas where the metal pads are located. Subsequently, the unit is dipped in a solvent, which washes away the uncured polyimide material, thus exposing the metal pads. This forms the sockets in the polyimide layer. Note that this is a "negative" photolithographic process, in which the light-exposed areas are protected from the subsequent material removal, as distinguished from a "positive" photolithographic process, in which the light-exposed areas are degraded to permit subsequent material removal. Also note that the removal of the unwanted polyimide material is accomplished by solvent, which is a different process from that used for photo-resist removal.

The following explains more precisely the chemical effects on the layer of "polyimide" material. The photosensitive "polyimide" solution consists of photo reactive amines and photo initiators added to polyamic acid. Exposure to UV light causes photo-induced rearrangement, forming an acid-amine ion linkage which is insoluble in the developer. A suitable developer (solvent) is Torray Industries material DV-505.

Figure 18:
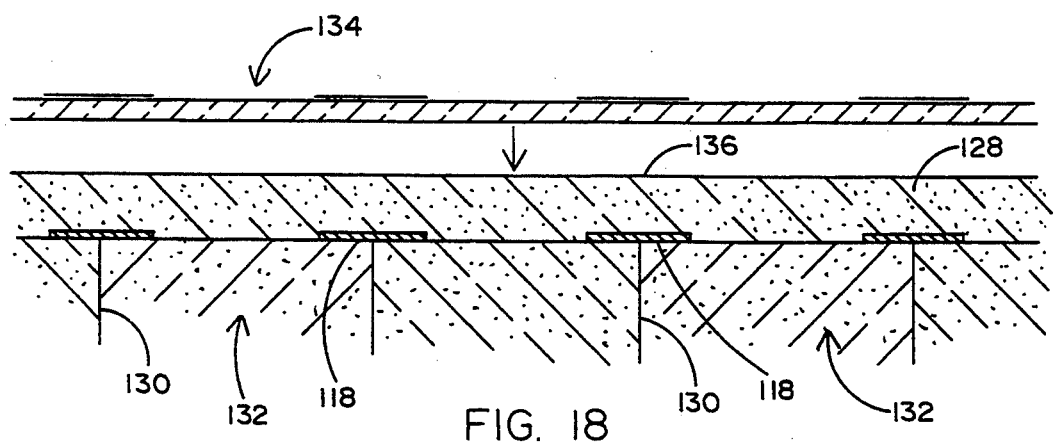
FIGS. 18–20 show the steps in the lithographic process by means of which the holes are formed in the dielectric layer at the desired locations.
Figure 19:
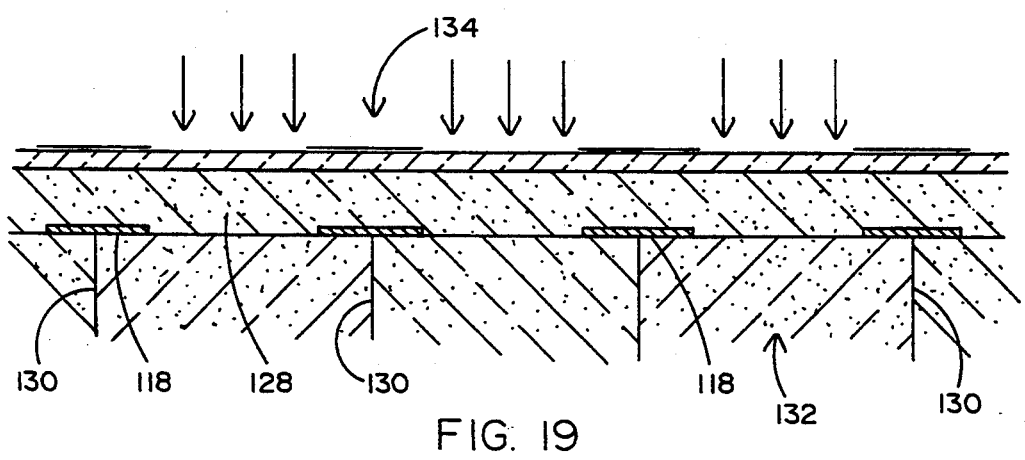
Figure 20:
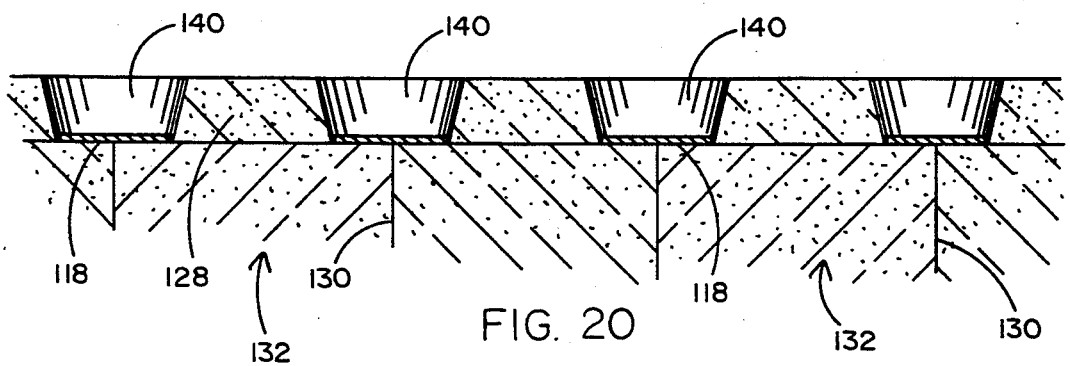

FIGS. 18-20 illustrate the steps which are used to form sockets leading to the metal pads 118. Note that each metal pad is electrically connected to a lead 130 formed as one of many such leads which lie between adjacent IC chips 132. FIG. 18 shows a mask 134 being applied to the top surface 136 of the polyimide layer 128. In FIG. 19, the arrows indicate the rays directed at layer 128 through mask 134. The light reaches the entire surface 136, except for the locations directly above the terminals 118. When the developer is applied, the material in layer 128 is insoluble, except for the portions directly above the terminals 118. The developer removes the unprotected portions, thereby forming the sockets 140 in FIG. 20, which are adapted to receive the solder bumps on the facing planar surface. Other processes could be used to form the sockets 140, e.g., plasma etching or laser ablation. Either of those processes would permit having more nearly vertical sides of the sockets.

When the solder bumps (or plugs) and their matching holes (or sockets) are ready to be brought together, suitable alignment marks (if available) on the facing planar surfaces may be microscopically aligned. The two planar surfaces are moved toward one another until they engage. If the plugs do not enter the sockets, slight horizontal movement of one of the planar surfaces is used for final alignment, which is attained when the two planar surfaces "lock", so that they are no longer relatively movable horizontally.

As is apparent, the present invention provides a major improvement over prior flip-chip bonding technologies. The proper alignment of the solder bumps with their matched terminals is guaranteed. No complicated alignment mechanism is required. And a further very important benefit is the ability to use the plug-and-socket technique to provide face-to-face bonding at a plurality of locations in the same final structure. This it true because transparent layers are not required for alignment purposes.

Figure 21:
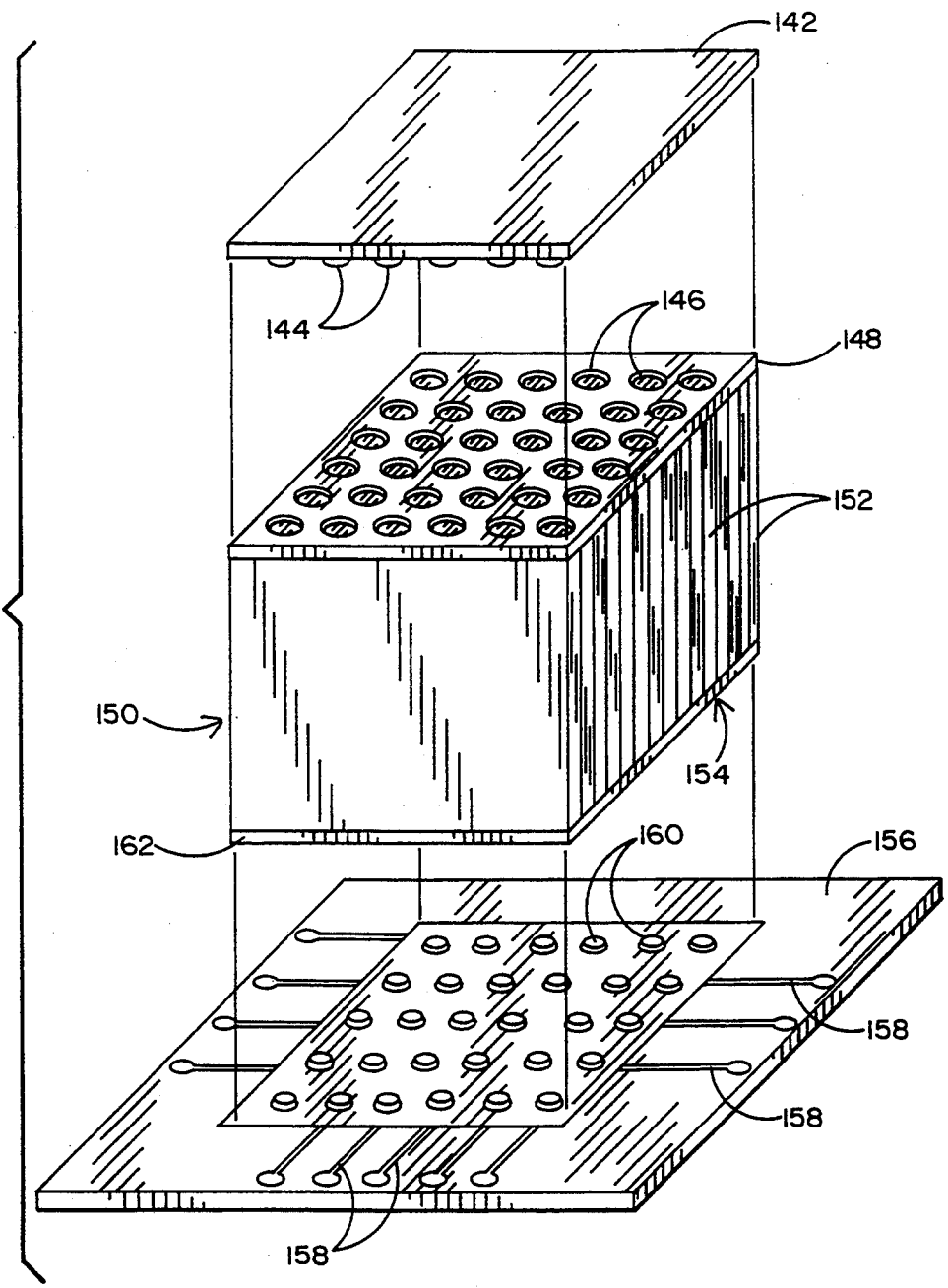
FIG. 21 shows a structure having two plug-and-socket bonding areas.
Figure 22:
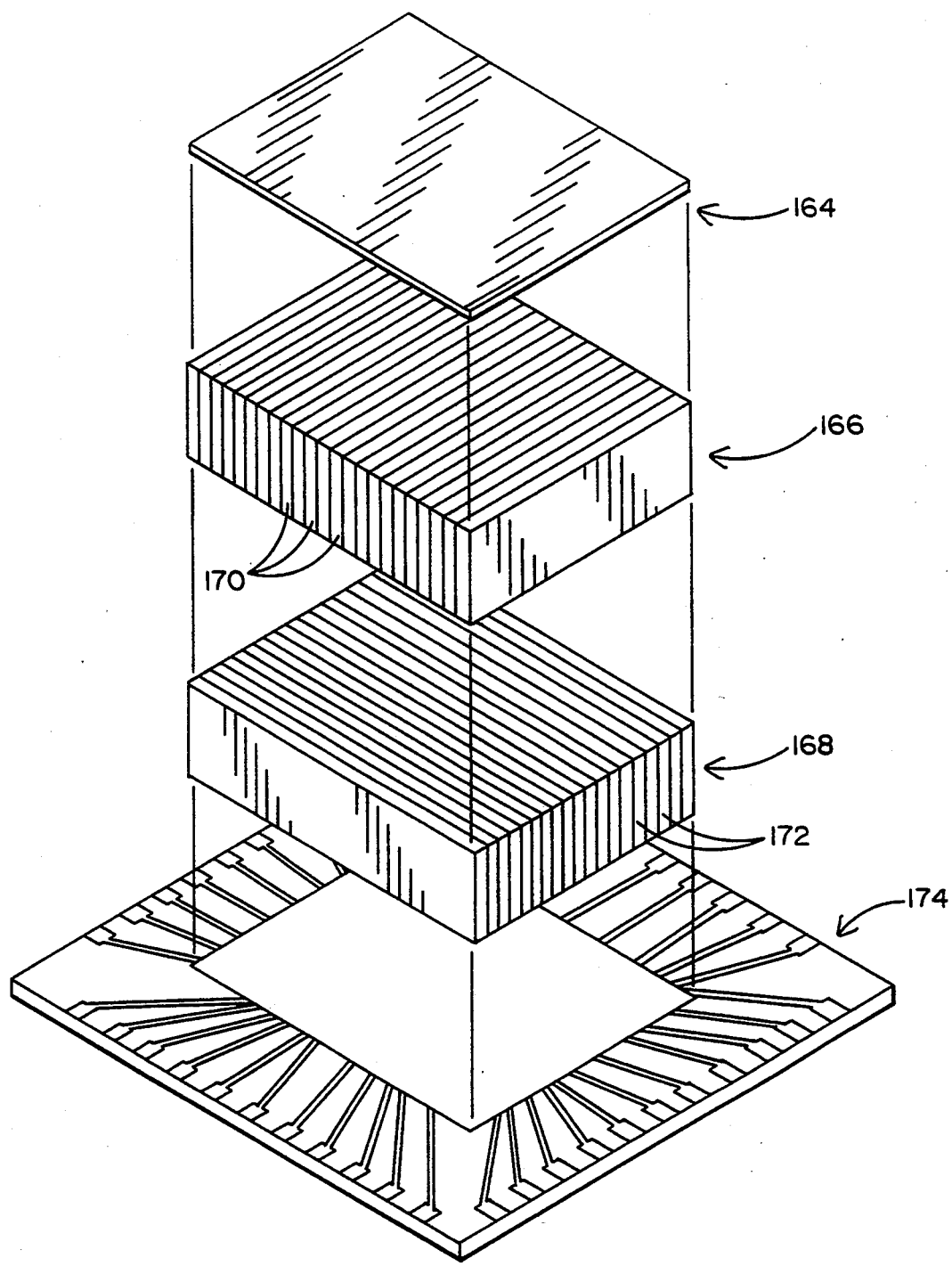
FIG. 22 shows a structure having three plug-and-socket bonding areas.

The latter benefit is illustrated in FIGS. 21 and 22. FIG. 21 shows a structure having two plug-and-socket bonding areas; and FIG. 22 shows a structure having three plug-and-socket bonding areas. In FIG. 21, a plate 142 provides a two-dimensional photodetector array. Each photodetector is connected to a separate solder bump 144 formed on the lower side of the plate 142. Each solder bump 144 is aligned with a hole 146 formed in a perforated dielectric layer 148, which is formed on the access plane of a module 150 having a multiplicity of stacked IC chips 152. When the plug-and-socket combination of solder bumps 144 and holes 146 has been joined, parallel electrical connections are provided from each photodetector to its associated IC circuitry. The solder connections also secure together plate 142 and module 150.

Another plug-and-socket combination is used to connect the backplane of module 150 (its lower end 154 in the figure) to a supporting substrate 156, which carries electrical conductors 158 leading to external circuitry. The sockets can be formed on either the backplane of the module 150 or the surface of substrate 156. In the figure the solder bumps 160 are mounted on the substrate 156; and the aligned holes are formed in a layer 162 of dielectric material formed on the backplane of module 150. The regular spacing of solder bumps 160 in the figure is not realistic for an actual structure, because backplane terminals have locations determined by the chip select ports and by the busses which run perpendicular to the layers of module 150. However, additional solder bumps, not required as electrical connections, may be included to give greater mechanical strength, and better heat conduction.

FIG. 22 shows schematically an even more impressive result of plug-and-socket planar bonding, resulting in a structure suitable for neural network hardware of the type disclosed in common assignee application Ser. No. 651,477, filed Feb. 6, 1991. A photodetector plate 164 is adapted to be connected by solder bumps and aligned holes to a stacked chip module 166. Module 166 in turn is adapted to be connected by solder bumps and aligned holes to another stacked chip module 168. Note that the IC chip layers 170 of module 166 extend in planes at right angles to the planes of IC chip layers 172 of module 168. The module 168 is adapted to be connected by solder bumps and aligned holes to a supporting substrate 174.

As previously stated, photo-definable polyimide material is considered the preferred material for the socket-providing layer. Photoresist material would be a more obvious choice, and was in fact applicant's initial choice. However, the polyimide material has certain major advantages. It is rugged material, and it can withstand high temperatures. It has the special feature of being cured (imidized) after the holes have been formed, which makes the final layer very resistant to damage.

Under certain conditions, however, a completely removable layer, e.g., a photoresist layer, might be preferred. That would be the case if it were desired to remove the entire socket-providing layer after soldering, in order to inject a layer of different material into the space around the solder connections. For example, an alpha particle barrier layer might be desired between the two facing planar surfaces. Certain types of ceramic substrates might make such a barrier layer desirable. In such a situation, one material would be used to dissolve and remove the photoresist at the hole locations; and a second material would be used to dissolve and remove the photoresist layer which remained after soldering. Thereafter, the barrier material would be caused to flow into the space between the facing planar surfaces.

FIG. 23-28 relate to a variation of the soldering method disclosed in the preceding figures. In a substantial number of situations it is desirable, or even necessary, to deposit a small amount of solder in each of the sockets, prior to insertion of the solder plugs into the sockets. There are at least three reasons for this additional preparation. One is to meet the need in some cases for low temperature processing. Avoiding high temperatures may be necessary in the vicinity of sensors, e.g., photodetectors. By depositing low temperature melting solder in sockets on the access plane of a stack of IC chips, it is possible to attach an array of photodetectors to the access plane with a low temperature solder melting process. In some cases, it may be desirable to avoid any heating, i.e., to use what is referred to as "cold welding". In order to make this feasible, the solder deposition in the sockets must not require a high temperature to cause solder flow. Although solder is deposited on both planar surfaces by a vacuum deposition process, that process can be accomplished with little or no temperature increase at the respective planar surface.

A second reason for depositing solder in the sockets derives from the metallurgy of the terminals at the bottom of the sockets. The terminals are usually formed of an oxidizing metal, such as nickel. In order to prevent oxidizing of the terminal metal, particularly during the processes which involve heating, it is common practice to cover each terminal with a very thin layer of gold.

Certain types of solder cause the gold to go into solution in the solder, thus in effect providing a solder-to-nickel contact.

Another advantage of having some solder in the sockets is that a reduction is possible in the height of the solder bumps on the facing surface. Because of the aspect ratio effect, lower solder bumps permit smaller bump base diameters, i.e., diameters engaging the facing surface. And such diameter reduction increases spacing between solder bumps, for a given center-to-center distance of solder bumps from one another.

Figure 23:
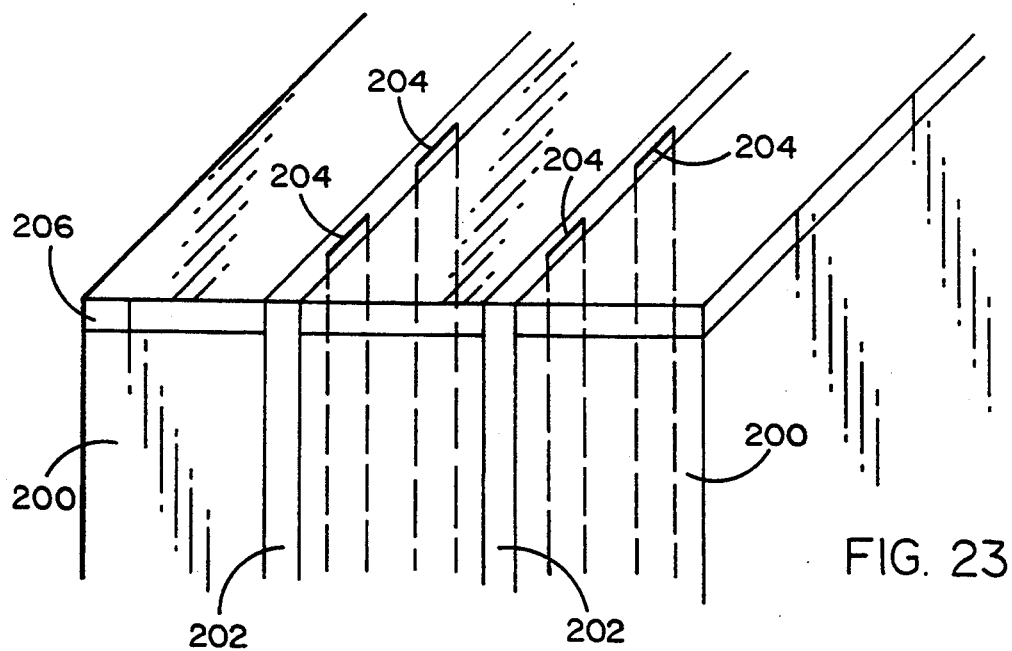
FIGS. 23–28 show the steps used in the process in which solder is deposited in each of the sockets (holes) prior to moving the first and second planar surfaces toward one another.

FIG. 23 shows a portion of the access plane of a stack of chips after the electrical leads on the plane have been cleared (i.e., exposed). Three silicon IC chips 200 are shown, with two glue lines 202 between adjacent chips, and a plurality of exposed electrical leads 204 within the glue lines, and thus insulated from the silicon. A layer of passivation 206 covers the access plane ends of the chips 200. The extension of glue lines 202 to the top of passivation layer 206 differs from some prior disclosures in common assignee patents. This difference is due to use of a wet etch to remove silicon from the access plane prior to applying the passivation. A wet etch acid may be used which removes the desired amount of silicon material, without etching back either the adhesive or the electrical leads. In earlier processes, plasma etching was used, which removed both silicon and adhesive, leaving only the leads protruding.

Figure 24:
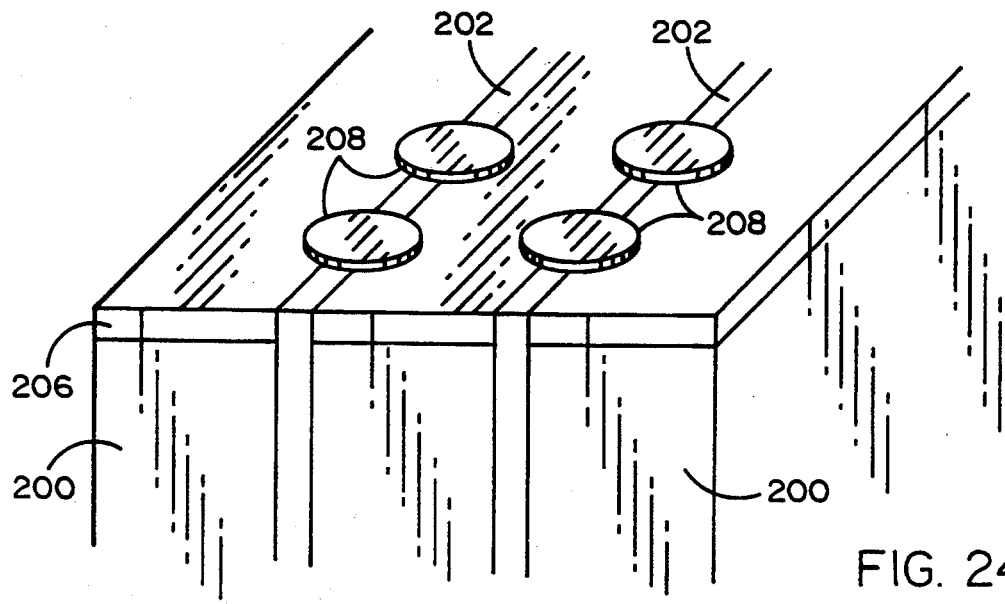

FIG. 24 shows the same structure after metal terminal pads 208 have been formed on top of each of the electrical leads. As stated above, the terminal pads 208 may be formed of nickel, or a nickel alloy, covered by a thin gold protection layer. The terminal pads 208 may each have a diameter of approximately 50 microns.

One advantage of the present process over prior art processes is that it permits use of different size terminal pads at different locations on the access plane. Such a variation would be useful if different current requirements exist at different locations.

Figure 25:
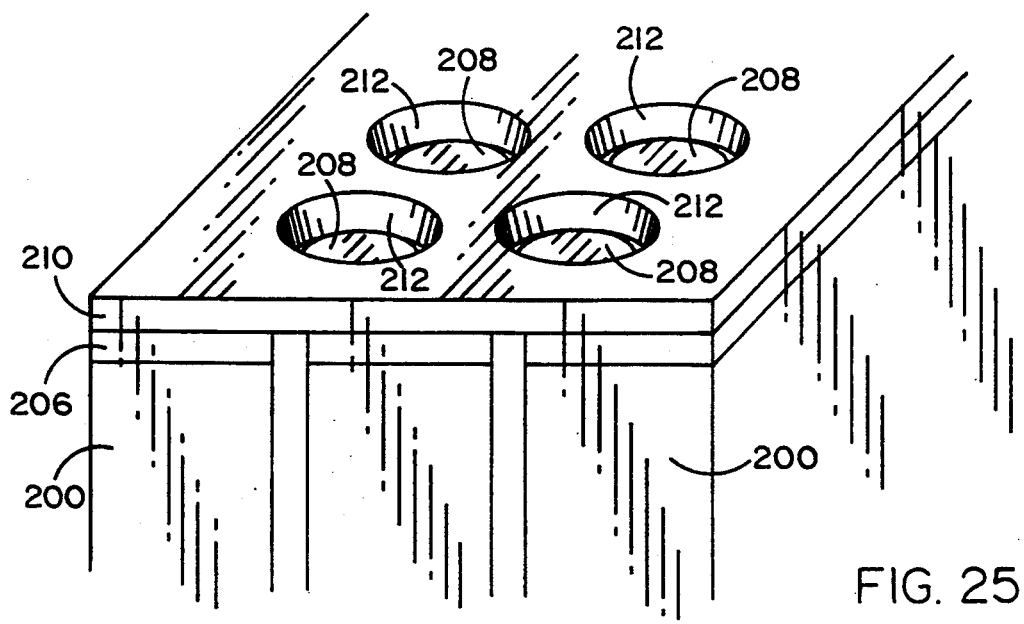

FIG. 25 shows the access plane after a second layer 210 of dielectric material has been deposited, and sockets (holes) 212 have been formed in layer 210 to expose the terminal pads 208. This part of the process may conform to the steps already described in this application relating to deposition of dielectric material and use of photolithography to form sockets. As shown, the sockets 212 are somewhat larger than terminal pads 208, i.e., they may have diameters of approximately 75 microns.

The deposition of solder material in the sockets 212 should be accomplished by another photolithography process, followed by vacuum deposition of the solder material. The curing of the polyimide layer 210 requires the use of high temperatures, which would oxidize the solder if it were already in place on terminal pads 208. A layer of photoresist material is formed on top of the entire access plane surface which appears in FIG. 25, including terminal pads 208. Then photolithography is used to open up holes in the photoresist directly over the terminals. Vacuum deposition, e.g., evaporation or sputtering, is used to form small solder bumps inside the sockets, in engagement with the terminal pads. Thereafter, the photoresist material is removed by a lift off step.

Figure 26:
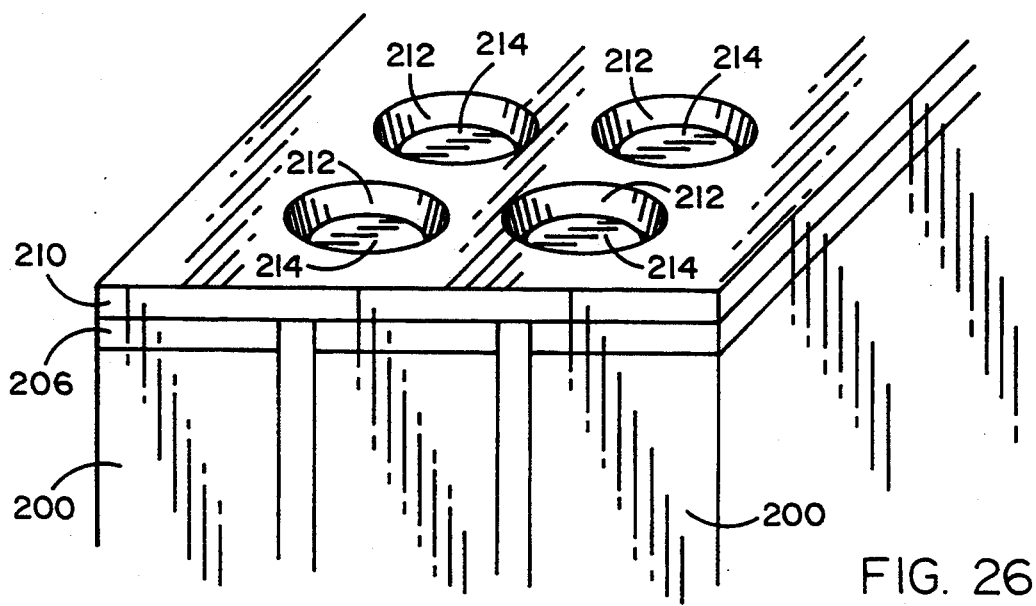
Figure 27:
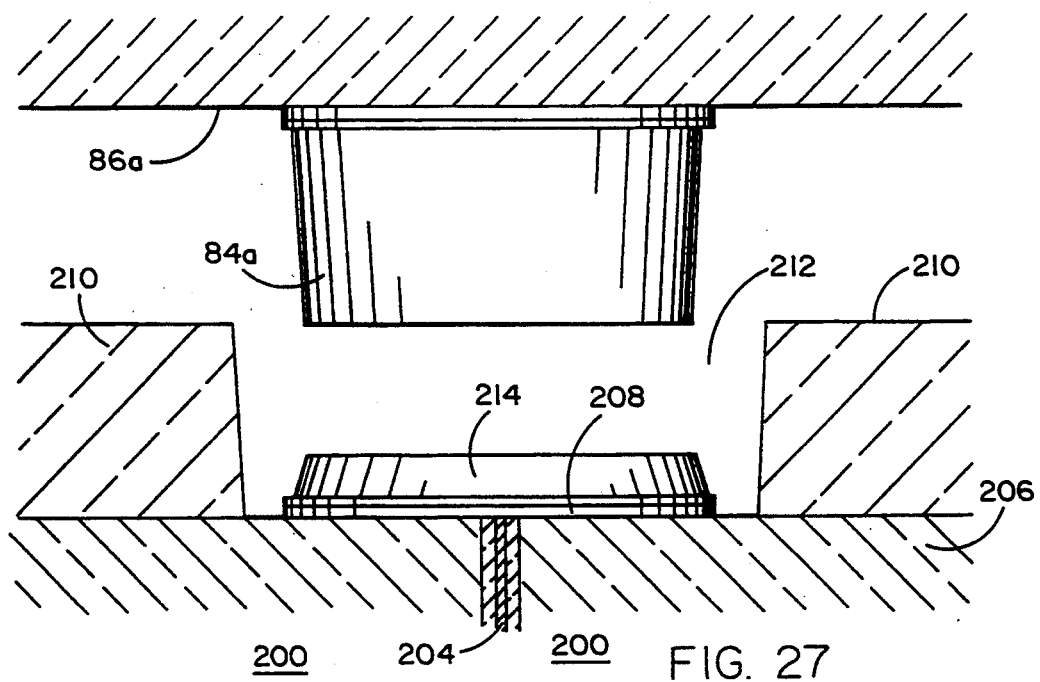
Figure 28:
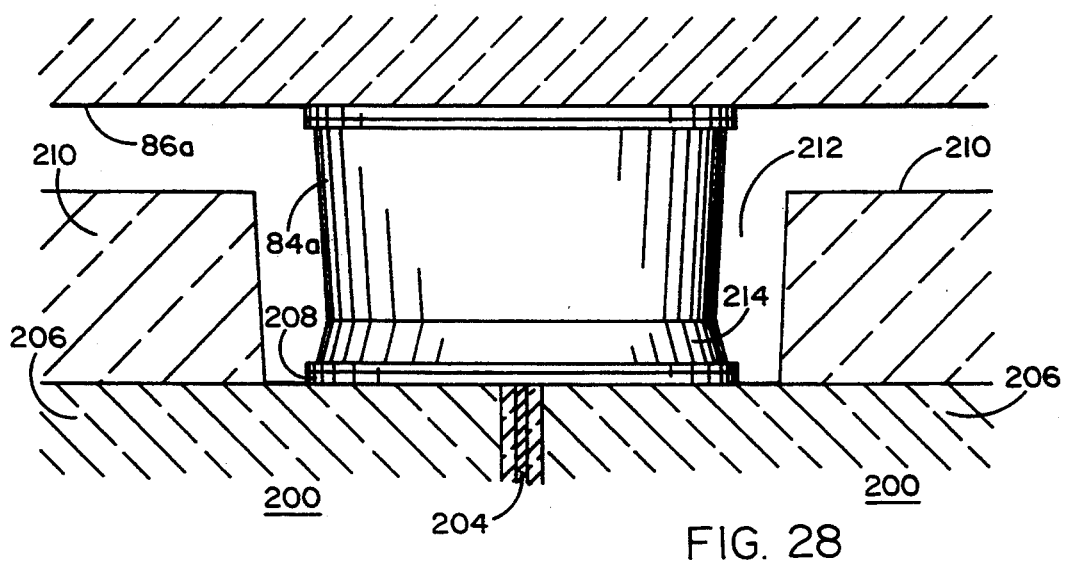

FIG. 26 shows small solder bumps 214 located in sockets 212 engaging terminal pads 208. Solder bumps 214 preferably have a thickness of only 2–3 microns. The remaining steps, which are shown in FIGS. 27 and 28, correspond to those described above, illustrated in FIGS. 10–14. Upper surface 86a has formed thereon a multiplicity of tall solder bumps 84a. The adjacent lower surface has the sockets 212, in which small solder bumps 214 are bonded to terminal pads 208. The two surfaces are moved toward one another. When solder bumps 84a enter sockets 212, proper alignment of the solder connections is assured. The solder bumps 84a are then brought into engagement with the small solder bumps 214, as shown in FIG. 28. Then the solder is caused to flow, in order to provide electrical and mechanical interconnection between the adjacent surfaces at the locations of their electrical terminals and, if necessary for mechanical reasons, at additional locations.

From the foregoing description, it will be apparent that the method and product disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A method for connecting a plurality of parallel electrical signal paths between first and second facing planar surfaces, each having a plurality of terminals located in aligned positions with terminals on the other surface, which method comprises:

forming solder bumps on the first facing planar surface, each bump electrically connected to one of the terminals on that surface;

applying a layer of permeable material to the second facing planar surface;

forming holes in the layer of permeable material, each hole adapted to be aligned with one of the solder bumps, and each hole extending through the layer of permeable material to uncover a terminal on the second facing planar surface;

moving the first and second facing planar surfaces toward one another until each solder bump on the first surface extends through a hole in the permeable layer to engage a terminal on the second planar surface;

relying on the entry of the solder bumps into the respective holes to insure alignment of the solder bumps with the respective terminals on the second planar surface; and causing the solder bumps to create solder connections between aligned terminals on the first and second facing planar surfaces.

2. The method of claim 1 which includes:

forming small solder bumps located in the holes and engaging the respective terminals on the second planar surface, in order to facilitate bonding between the solder bumps on the first surface and the terminals on the second surface.

3. The method of claim 1 in which the solder bumps create a mechanical connection between the first and second facing planar surfaces.

4. The method of claim 1 in which light is caused to penetrate openings in a mask in order to prepare the layer of permeable material for the forming of holes therein in the desired locations.

5. The method of claim 4 in which the layer of permeable material is photo-definable polyimide material.

6. The method of claim 5 in which the polyimide material remaining after formation of the holes therein is further solidified by heating it to a suitable temperature.

7. The method of claim 5 in which the layer of polyimide material is initially applied to the second facing planar surface by placing it as a viscous liquid on that surface, and then spinning the surface to spread and initially solidify the polyimide material.

8. The method of claim 1 in which the height of each solder bump is greater than the depth of its aligned hole, in order to compensate for any local distance variations between the first and second facing planar surfaces.

9. The method of claim 8 in which the distance moved as the first and second planar surfaces are moved toward one another is less than the difference between the height of the solder bumps and the depth of the holes.

10. The method of claim 3 in which additional solder bumps are connected between the first and second facing planar surfaces, in order to increase the strength of the mechanical connection.

11. The method of claim 1 which includes the following step:
removing the layer of permeable material after the solder bump connections have been created.

12. The method of claim 11 which includes the following step:
injecting a layer of different material between the facing planar surfaces after the initial layer of permeable material has been removed.

13. The method of claim 1 in which:
the solder bumps each are formed with a base portion composed of a higher melting point material and a tip portion composed of a lower melting point material.

14. The method of claim 1 in which the amount of solder bump material is insufficient to fill the hole surrounding the solder bump.

15. The method of claim 1 in which the second surface is the access plane of a stack of IC chips which constitute layers extending in planes perpendicular to the access plane.

16. The method of claim 1 in which the center-to-center distance between adjacent solder bumps is not substantially greater than 0.010 inch.

17. The method of providing a multiplicity of parallel electrical connections, comprising:
forming a first planar surface having (a) a plurality of electrically conductive terminals, and (b) a plurality of electrically conductive plugs each connected to one of said terminals;
forming a second planar surface adapted to be parallel to and aligned with the first planar surface, said second surface having (a) a plurality of electrically conductive terminals opposite those on the first planar surface, and (b) a plurality of sockets which receive the respective plugs on the first planar surface;
moving the first and second planar surfaces to cause the plugs to enter their respective sockets;
determining whether the plugs have entered the sockets in such a way as to lock the two planar surfaces in aligned position; and
thereafter causing the plugs to bond to the second surface terminals.

18. The method of claim 17 in which the plugs are caused to provide an effective mechanical connection between the first and second planar surfaces.

19. The method of claim 17 in which the second surface is the access plane of a stack of IC chips which constitute layers extending in planes perpendicular to the access plane.

20. The method of claim 17 which includes:
forming a layer of dielectric material on the second planar surface; and
opening holes which extend through the dielectric material in order to provide the sockets.

21. The method of claim 17 which includes:
combining a higher melting point base portion and a lower melting point tip portion to constitute each electrically conductive plug.

22. The method of claim 17 which includes:
depositing small amounts of bonding material located in the respective sockets and engaging the respective terminals on the second surface, in order to facilitate bonding between the plugs on the first surface and the terminals on the second surface.

23. The method of claim 17 in which:
the step of determining whether the plugs and sockets have locked in aligned position is accomplished by using their relative movability in a parallel plane.

24. The method of claim 23 which includes the following step:
causing relative planar motion between the first and second planar surfaces to permit entry of the plugs into the sockets.

25. The method of claim 17 in which the center-to-center distance between adjacent plugs is not substantially greater than 0.010 inch.

* * * * *